United States Patent
Gangopadhyay et al.

(10) Patent No.: US 10,490,679 B2
(45) Date of Patent: *Nov. 26, 2019

(54) FABRICATION OF MULTILAYER NANOGRATING STRUCTURES

(71) Applicant: The Curators of the University of Missouri, Columbia, MO (US)

(72) Inventors: Shubhra Gangopadhyay, Colombia, MO (US); Sangho Bok, Cedar City, UT (US); Samiullah Pathan, Columbia, MO (US); Cherian Joseph Mathai, Columbia, MO (US); Sagnik Basuray, Parsippany, NJ (US); Keshab Gangopadhyay, Columbia, MO (US); Biyan Chen, Columbia, MO (US); Sheila Grant, Columbia, MO (US); Aaron Wood, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/158,977

(22) Filed: Oct. 12, 2018

(65) Prior Publication Data

US 2019/0051863 A1 Feb. 14, 2019

Related U.S. Application Data

(63) Continuation of application No. 15/543,150, filed as application No. PCT/US2017/016822 on Feb. 7, 2017, now Pat. No. 10,103,357.

(Continued)

(51) Int. Cl.
*H01L 31/0236* (2006.01)
*H01L 31/0216* (2014.01)
(Continued)

(52) U.S. Cl.
CPC ...... *H01L 31/02366* (2013.01); *B82B 3/0038* (2013.01); *B82B 3/0047* (2013.01);
(Continued)

(58) Field of Classification Search
CPC ............ H01L 31/0216; H01L 31/0232; H01L 31/02322; H01L 31/02327;
(Continued)

(56) References Cited

U.S. PATENT DOCUMENTS 6,738,141 B1 5/2004 Thirstrup
7,154,598 B2 12/2006 Montagu et al.
(Continued)

FOREIGN PATENT DOCUMENTS

JP 2009203120 A 9/2009
KR 20030012588 A 2/2003
(Continued)

OTHER PUBLICATIONS

Notification of Transmittal of the International Search Report and the Written Opinion of the International Searching Authority, or the Declaration dated May 4, 2017; International Application No. PCT/US2017/016822; International Filing Date: Feb. 7, 2017; Applicant: The Curators of the University of Missouri.

(Continued)

*Primary Examiner* — Eduardo A Rodela
(74) *Attorney, Agent, or Firm* — Erise IP, P.A.

(57) ABSTRACT

Provided are nanograting structures and methods of fabrication thereof that allow for stable, robust gratings and nanostructure embedded gratings that enhance electromagnetic field, fluorescence, and photothermal coupling through surface plasmon or, photonic resonance. The gratings produced exhibit long term stability of the grating structure and improved shelf life without degradation of the properties such as fluorescence enhancement. Embodiments of the (Continued)

invention build nanograting structures layer-by-layer to optimize structural and optical properties and to enhance durability.

19 Claims, 2 Drawing Sheets

Related U.S. Application Data

(60) Provisional application No. 62/296,253, filed on Feb. 17, 2016.

(51) Int. Cl.

| | | |
|---|---|---|
| H01L 33/50 | (2010.01) | |
| H01L 33/44 | (2010.01) | |
| H01L 31/0232 | (2014.01) | |
| H01L 29/66 | (2006.01) | |
| G02B 1/14 | (2015.01) | |
| G02B 1/18 | (2015.01) | |
| B82B 3/00 | (2006.01) | |
| C01G 23/04 | (2006.01) | |
| C08J 5/00 | (2006.01) | |
| G02B 1/04 | (2006.01) | |
| G02B 1/12 | (2006.01) | |
| G02B 5/00 | (2006.01) | |
| G02B 5/18 | (2006.01) | |
| G02B 5/20 | (2006.01) | |
| G02B 27/42 | (2006.01) | |
| G02B 27/44 | (2006.01) | |
| H01L 21/02 | (2006.01) | |
| H01L 51/52 | (2006.01) | |
| G02B 5/30 | (2006.01) | |
| B82Y 40/00 | (2011.01) | |

(52) U.S. Cl.
CPC .............. *C01G 23/04* (2013.01); *C08J 5/005* (2013.01); *G02B 1/04* (2013.01); *G02B 1/12* (2013.01); *G02B 1/14* (2015.01); *G02B 1/18* (2015.01); *G02B 5/008* (2013.01); *G02B 5/18* (2013.01); *G02B 5/1809* (2013.01); *G02B 5/1847* (2013.01); *G02B 5/1852* (2013.01); *G02B 5/1861* (2013.01); *G02B 5/1866* (2013.01); *G02B 5/203* (2013.01); *G02B 5/3058* (2013.01); *G02B 27/42* (2013.01); *G02B 27/4244* (2013.01); *G02B 27/44* (2013.01); *H01L 21/02107* (2013.01); *H01L 21/02109* (2013.01); *H01L 21/02112* (2013.01); *H01L 29/66977* (2013.01); *H01L 31/0216* (2013.01); *H01L 31/0232* (2013.01); *H01L 31/02322* (2013.01); *H01L 31/02327* (2013.01); *H01L 33/44* (2013.01); *H01L 33/50* (2013.01); *H01L 33/501* (2013.01); *H01L 33/508* (2013.01); *H01L 51/52* (2013.01); *H01L 51/5209* (2013.01); *H01L 51/5215* (2013.01); *H01L 51/5218* (2013.01); *H01L 51/5275* (2013.01); *B82Y 40/00* (2013.01)

(58) Field of Classification Search
CPC ... H01L 31/02366; H01L 33/44; H01L 33/46; H01L 33/50; H01L 33/501; H01L 33/508; H01L 33/58; H01L 33/60; H01L 29/66977

See application file for complete search history.

(56) References Cited

U.S. PATENT DOCUMENTS

| | | |
|---|---|---|
| 7,776,341 B2 | 8/2010 | Belisle et al. |
| 7,943,092 B2 | 5/2011 | Xiao et al. |
| 8,617,824 B2 | 12/2013 | Poetter et al. |
| 8,765,360 B2 | 7/2014 | Wang et al. |
| 8,829,097 B2 | 9/2014 | Deaner et al. |
| 9,268,915 B2 | 2/2016 | Holmes et al. |
| 9,469,876 B2 | 10/2016 | Kuslich et al. |
| 9,518,986 B2 | 12/2016 | Blackburn et al. |
| 9,786,845 B1 | 10/2017 | Smith et al. |
| 2004/0095621 A1 | 5/2004 | Funada et al. |
| 2004/0179196 A1 | 9/2004 | Hart |
| 2009/0179637 A1 | 7/2009 | Cunningham et al. |
| 2010/0081282 A1 | 4/2010 | Chou et al. |
| 2010/0085566 A1 | 4/2010 | Cunningham |
| 2010/0260030 A1 | 10/2010 | Tao et al. |
| 2011/0043918 A1 | 2/2011 | Crouse et al. |
| 2011/0216255 A1 | 9/2011 | Miyauchi et al. |
| 2012/0009431 A1 | 1/2012 | Kazeto |
| 2012/0266957 A1 | 10/2012 | Wang et al. |
| 2012/0309080 A1* | 12/2012 | Cunningham ....... G01N 21/658 435/288.7 |
| 2013/0120743 A1 | 5/2013 | Mirajkar et al. |
| 2013/0299796 A1 | 11/2013 | Masuyama et al. |
| 2014/0146393 A1 | 5/2014 | Baba et al. |
| 2017/0309792 A1 | 10/2017 | Tischler et al. |

FOREIGN PATENT DOCUMENTS

| | | |
|---|---|---|
| KR | 20090083547 A | 8/2009 |
| WO | 9013993 A2 | 11/1990 |
| WO | 0114885 A2 | 3/2001 |
| WO | 2007007185 A2 | 1/2007 |
| WO | 2008063368 A2 | 5/2008 |
| WO | 2010054337 A2 | 5/2010 |
| WO | 2010103386 A1 | 9/2010 |
| WO | 2017046320 A1 | 3/2017 |
| WO | 2017053586 A1 | 3/2017 |

OTHER PUBLICATIONS

Bihtler Daglar et al. Soft biometric tapered nanostructures for large-area antireflective surfaces and SERS sensing. Journal of Materials Chemistry C., 2013, No. 1, pp. 7842-7848.

Mukti Aryal et al. Imprinted large-scale high density polimer nanopillars for organic solar cells. Journal of Vacuum Scince and Technology B. 26 (6), Nov./Dec. 2008.

* cited by examiner

FABRICATION OF MULTILAYER NANOGRATING STRUCTURES

RELATED APPLICATIONS

This patent application is a continuation application of U.S. patent application Ser. No. 15/543,150, filed on Jul. 12, 2017, and entitled "FABRICATION OF MULTILAYER NANOGRATING STRUCTURES," and which issued as U.S. Pat. No. 10,103,357 on Oct. 16, 2018, ("the '357 patent"). The '357 patent claims priority benefit, with regard to all common subject matter, of earlier-filed PCT Intl App. No. PCT/US2017/016822, filed Feb. 7, 2017, and entitled "FABRICATION OF MULTILAYER NANOGRATING STRUCTURES," which claims priority to U.S. Provisional Patent Application No. 62/296,253, filed Feb. 17, 2016, and entitled "FABRICATION OF MULTILAYER NANOGRATING STRUCTURES." The identified earlier-filed patent, PCT patent application, and U.S. provisional patent application are hereby incorporated by reference in their entirety into the present application.

This non-provisional patent application shares certain subject matter with earlier-filed U.S. patent application Ser. No. 14/081,353, filed Nov. 15, 2013, and entitled Nano-gap Grating Devices with Enhanced Optical Properties and Methods of Fabrication. The identified earlier-filed patent application is hereby incorporated by reference in its entirety into the present application.

BACKGROUND

1. Field

Embodiments of the invention generally relate to nanograting structures for use in optical imaging, biosensing, photothermal coupling and other related applications.

2. Related Art

Uniform, periodic nanograting structures are used in microscopic imaging of small objects in fields including medicine, biological research, cancer research, metallurgy and others to circumvent the diffraction limits for particular wavelengths of light. They are also used in fluorescence spectroscopy for ultrasensitive chemical and biological sensors to improve image contrast and detection thresholds. However, due to the extremely small scale of these structures, traditional fabrication techniques require expensive and complex equipment and the resulting nanograting structures lack stability and quickly degrade.

SUMMARY

Embodiments of the invention address the above-described problems by providing for improved methods for fabrication, resulting in nanograting structures that are stable and non-degradable for use in plasmons and photonic crystal applications. In particular, in a first embodiment, the invention includes a method of manufacturing a nanograting structure, comprising the steps of coating a mold in a solution of a polymer dissolved in a solvent to obtain a grating, transferring the grating to a substrate, vapor treating the grating with a crosslinker, annealing the grating, treating the grating with a hydrophilicity agent, depositing a reflective layer on the grating, and depositing a capping layer on top of the reflective layer.

In a second embodiment, the invention includes a nanograting structure, comprising a substrate, a polymer grating treated with a crosslinker, wherein the polymer grating has been annealed for further crosslinking, and wherein the polymer grating has been treated a hydrophilicity agent to render a surface of the polymer grating hydrophilic, a reflective layer over the polymer grating, and a capping layer on top of the reflective layer.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
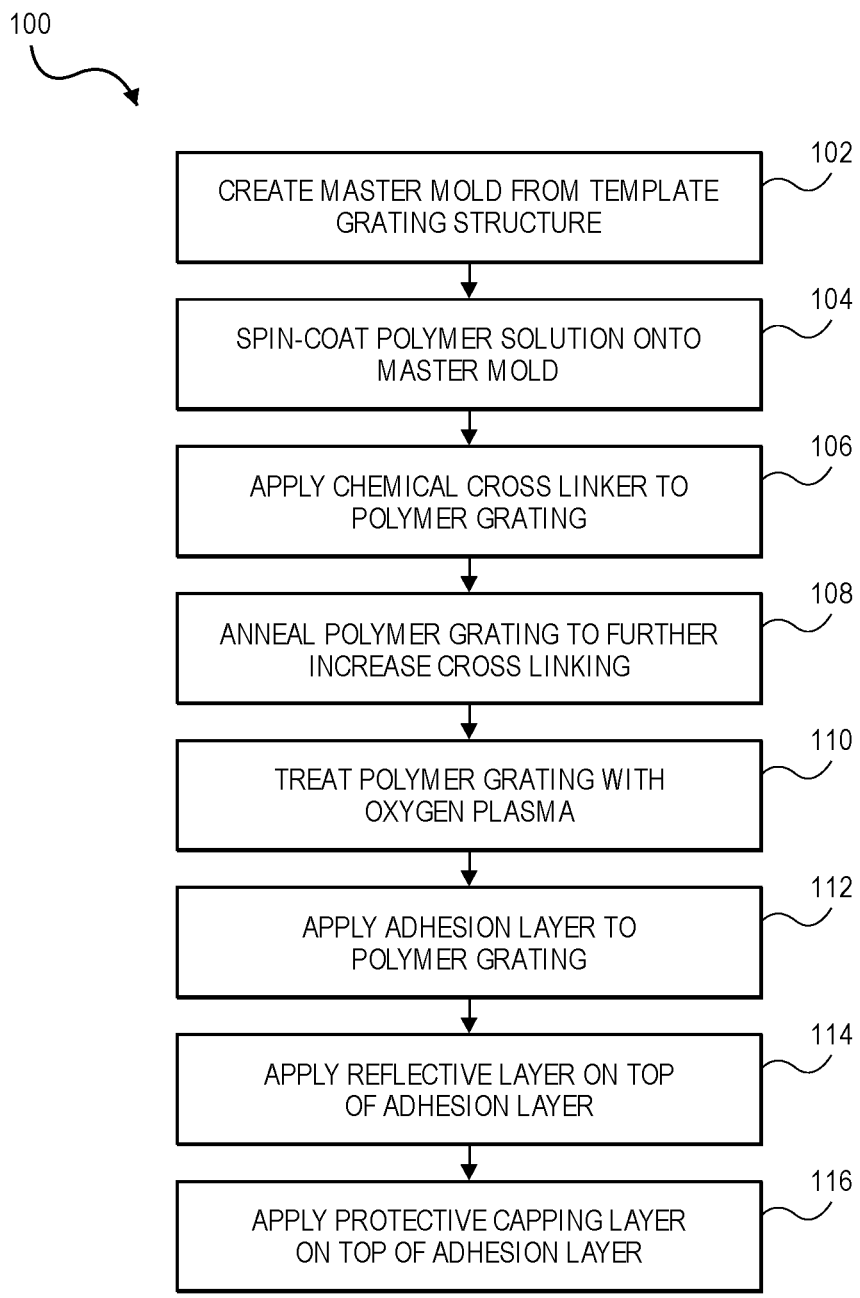
FIG. 1 depicts a flowchart depicting a method of fabricating nanograting structures in accordance with embodiments of the invention.

The drawing figures do not limit the invention to the specific embodiments disclosed and described herein. The drawings are not necessarily to scale, emphasis instead being placed upon clearly illustrating the principles of the invention.

DETAILED DESCRIPTION

At a high level, embodiments of the invention allow for simplified fabrication of nanograting structures with improved properties. In particular, a first plastic mold is taken from a template grating. This nanograting mold, once appropriately cured, can be spin-coated with a polymer dissolved in an appropriate solvent. Once separated from the polymer mold, this polymer grating retains a highly detailed impression of the transferred nano-structures. However, in this state, the polymer grating is subject to structural changes and degradation from mechanical forces and reflow. To prevent these structural changes, a chemical crosslinker can be used to improve the mechanical properties of the polymer, and then an annealing process can be used to further increase crosslinking and therefore the mechanical properties of the polymer grating.

For use in optical applications, a reflective layer must be applied on top of the polymer grating. However, the polymer gratings at this stage are hydrophobic, resulting in poor adhesion of subsequent layers. Accordingly, they are next treated (for example, with plasma) to convert terminal methyl groups to hydroxyl and carboxyl groups, thus rendering the surface hydrophilic. To further increase adhesion, an adhesion layer (such as a layer of chromium, germanium, or titanium or, nickel or, aluminum and other similar metal or ceramic) is applied to the plasma-treated gratings and a reflective layer (such as a layer of silver, gold, platinum, aluminum or other similar metals or alloys) is applied over the adhesion layer. The resulting gratings have the desired optical properties; however, these properties can be quickly lost in use due to degradation of the reflective layer (e.g., oxidative damage and cluster formation in a silver reflective layer). In addition to plasmonic enhancements, the reflective layer can be also be made of a dielectric such as titania, silica, alumina, or ITO giving rise to the development of a photonic crystal device. Accordingly, a final capping layer (such as a layer of alumina, silica, titania or, similar oxide) is applied over the reflective layer to protect it.

The subject matter of embodiments of the invention is described in detail below to meet statutory requirements; however, the description itself is not intended to limit the scope of claims. Rather, the claimed subject matter might be embodied in other ways to include different steps or combinations of steps similar to the ones described in this document, in conjunction with other present or future technologies. Minor variations from the description below will be obvious to one skilled in the art, and are intended to be captured within the scope of the claimed invention. Terms should not be interpreted as implying any particular ordering of various steps described unless the order of individual steps is explicitly described.

The following detailed description of embodiments of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of embodiments of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate reference to "one embodiment" "an embodiment", or "embodiments" in this description do not necessarily refer to the same embodiment and are also not mutually exclusive unless so stated and/or except as will be readily apparent to those skilled in the art from the description. For example, a feature, structure, or act described in one embodiment may also be included in other embodiments, but is not necessarily included. Thus, the technology can include a variety of combinations and/or integrations of the embodiments described herein.

Turning now to FIG. 1, a flowchart depicting a method of fabricating nanograting structures in accordance with embodiments of the invention is depicted and referred to generally by reference numeral 100. Initially, at step 102, a master mold (also called a stamp) is created from a template grating structure by applying a plastic material to the template grating structure. The plastic material may be any flexible, somewhat resilient polymer that can adapt to the shape of a mold and retain that shape. An exemplary plastic material is polydimethylsiloxane (PDMS), although other flexible polymers can also be used. The template grating structure may be any solid object including an appropriate nanograting pattern, and may be created via patterning and etching, electron-beam lithography, reactive ion etching, machining, or other techniques. A master mold may also be re-purposed from a commercial product containing appropriate grating patterns, such as a compact disc (CD), a digital video disc (DVD), a high definition DVD (HD-DVD), a Blu-Ray™ disc, etc., which includes an internal data layer defined by a grating pattern. Techniques for creating a master mold are further discussed in the related U.S. patent application Ser. No. 14/081,353 as incorporated by reference above.

Once the plastic material has been applied to the template grating structure to create the master mold, the master mold can be cured appropriately based on the plastic material. For example, if PDMS is used for the plastic material, the master mold may be cured at room temperature under controlled humidity (for example, at 60% relative humidity) to allow appropriate hydrosilylation (also known as "crosslinking") reactions to take place to improve the mechanical properties of the PDMS. Other plastic materials may be cured differently, such as via the application of curing catalysts or curing agents, ultraviolet or other light, or simply via time. Some plastic materials may have acceptable mechanical properties immediately and may not require a curing process.

Once the master mold has been created, a polymer can be applied to the master mold to create the base layer of the grating structure at step 104. For example, poly(methylsilsesquioxane) (PMSSQ), nitrocellulose, THV (a polymer of tetrafluoroethylene, hexafluoropropylene and vinylidene fluoride), Teflon, Polyvinyl Alcohol (PVA), or similar polymer can be used as the polymer. If PMSSQ is used, it can be dissolved in an appropriate solvent (such as ethanol, propylene glycol monomethyl ether acetate (PGMEA) or other appropriate solvent) and spin coated onto the master mold. The polymer can be applied either immediately or after the solvent has evaporated and the plastic has reached an appropriate degree of crosslinking on the master mold to an appropriate substrate (such as a glass slide or a silicon wafer) and removed from the master mold. Techniques for transferring the polymer grating from the master mold to the substrate are also discussed in greater detail in the related U.S. patent application Ser. No. 14/081,353 as incorporated by reference above. Regardless of the techniques used, at the end of step 104, a polymer grating on a substrate has been obtained. This polymer grating has a highly accurate replication of the desired nanograting structure, but poor mechanical properties due to a lack of crosslinking in the polymer.

To improve the mechanical properties of the polymer grating and prevent mechanical damage or reflow of the polymer from changing the nanograting structure, the crosslinking of the polymer grating can be improved. At step 106, a chemical crosslinker (such as 3-aminopropyltriethoxysilane (APTES) for PMSSQ, trimethylchlorosilane (TMCS), or another crosslinker appropriate to the polymer used) is applied to the polymer grating. In some embodiments, the crosslinker is applied in vapor form. In such embodiments, the polymer gratings can be placed in a vacuum chamber with an open container of the crosslinker. A vacuum can then be applied to encourage evaporation of the crosslinker, and then the vacuum can be turned off to allow for vapor movement. In one such embodiment, the vacuum is applied for ten minutes and removed for ten minutes, and this process is repeated for one hour. In another embodiment, vacuum is applied for 10 minutes (until a pressure of approximately −81 kilopascals is reached), and maintained for one hour. In some embodiments, the vapor pressure of the crosslinker can further be increased by mixing it with a solvent (such as ethanol) with high vapor pressure.

Next, at step 108, crosslinking can be further increased internally in the polymer gratings via the process of thermally annealing them. In some embodiments, the process of annealing the polymer gratings begins with a relatively low-temperature, high-duration annealing step. For example, the gratings may be heated to 60 degrees Celsius for three hours. This allows for the evaporation of any remaining solvent from the spin-coating process and initiates crosslinking in the gratings without subjecting them to heat levels that would cause reflow of the polymer. In some embodiments, the grating can then be subjected to a second annealing step at a higher temperature for a shorter time. For example, the gratings may be gradually heated (e.g., at a rate of 1 degree Celsius per minute) to a temperature of 400 degrees Celsius and kept there for one hour. In other embodiments, the second annealing step can take place at 200 degree Celsius, at 550 degrees Celsius, at 600 degrees Celsius, or at any other temperature to achieve the desired crosslinking without breaking down the polymer. The crosslinking process of steps 106 and 108 improve the mechanical properties of the polymer gratings without appreciably changing the nanograting structures, resulting in stable polymer gratings that can be used in high-temperature processes such as atomic layer deposition (ALD), electron-beam deposition, thermal and sputtering deposition of metals and dielectric materials, including but not limited to gold, silver, platinum, silica, alumina, titania, indium tin oxide (ITO), and diamond like carbon (DLC).

When used in optical applications, a reflective layer is typically applied to the polymer gratings to couple better with photons and enhance fluorescence. However, adhesion between typical metallic reflective layer materials and untreated polymer gratings is typically poor due to the hydrophobic surface layer of the polymer. For example, when PMSSQ is used, the non-polar surface methyl groups render the polymer grating hydrophobic. To improve adhesion, these surface methyl groups can be rendered polar (and the surface thereby rendered hydrophilic) via oxidation. In some embodiments, step 110 treats the polymer grating with a hydrophilicity agent, such as plasma (such as oxygen or carbon dioxide plasma) or ozone to convert surface methyl groups to hydroxyl groups and carboxyl groups. For example, the polymer gratings can be treated by oxygen plasma for 30 seconds at a power of seven watts.

Once the surface has been rendered hydrophilic, an adhesion layer can be applied to the plasma-treated polymer grating at step 112. The adhesion layer allows for better overall adhesion than if the reflective layer were applied directly to the plasma-treated polymer grating. In some embodiments, chromium is used for the adhesion layer. In other embodiments, other materials such as chromium (III) oxide (also called chromia), germanium, titanium, or titanium (IV) oxide (also called titania) can be used. In some embodiments, the adhesion layer is approximately five nanometers thick. In other embodiments, it is approximately ten nanometers thick to approximately fifteen nanometers thick. Any of a variety of known techniques can be used for the application of the adhesion layer. For example, thermal evaporation can be used to deposit the adhesion layer on the plasma-treated polymer grating. When using such a process, the adhesion layer may be deposited at a rate of approximately 0.005 nanometers per second.

Once the adhesion layer has been applied, the reflective layer can be applied on top of the adhesion layer at step 114. In some embodiments, the adhesion layer can be made of silver. In other embodiments, the reflective layer can be made of gold or platinum, or from a mixtures of these and other materials, as discussed above. In some embodiments, the reflective layer is approximately 100 nanometers thick. In other embodiments, the reflective layer is 10 nanometers thick to 300 nanometers thick. Other thicknesses may also be used depending on the application and the materials used. In some embodiments, the adhesion layer and the reflective layer can be applied sequentially for better bonding. For example, in the example above, the thermal deposition of chromium at a rate of 0.005 nanometers per second can immediately proceed to a deposition of a silver reflective layer at 0.005-0.01 nanometers per second until five nanometers of the silver reflective layer have been deposited, and then the rate of deposition increased to 0.05 nanometers per second until the desired thickness of the reflective layer has been reached.

The nanograting structure thus produced has good structural and reflective properties, but is subject to degradation over time, due to oxidation and cluster formation. To preserve the grating, a protective capping layer is applied at step 116. In some embodiments, this capping layer can be made of aluminum (III) oxide (also called alumina). In other embodiments, the capping layer can be made of silicon (IV) oxide (also called silica), titanium (IV) oxide (also called titania) or other appropriate metallic or non-metallic materials. In some embodiments, the protective capping layer is approximately ten nanometers thick. In other embodiments, the capping layer is five nanometers or twenty nanometers thick. In some embodiments, the capping layer is deposited using one of the deposition techniques described above. In other embodiments, the capping layer can be deposited using other techniques, such as atomic layer deposition. When using atomic layer deposition, the reflective layer of the nanograting structure may be further annealed to promote grain growth in the reflective layer. For example, the gratings may be placed under vacuum or non-reactive atmosphere as the temperature is ramped to a desired annealing temperature (e.g., from 60 to 300 degrees Celsius) for a desired time (e.g., 2 hours).

After annealing, a first precursor can be pulsed over the surface to add functional groups and improve the surface conditions for subsequent reactions with additional precursors to form the capping layer. For example, water can be pulsed over the surface for 20 milliseconds with a wait of 8 seconds between pulses for 50 cycles to form surface hydroxyl groups. Once the surface is prepared, additional precursors can be pulsed over the surface to react with the previously created functional groups. For example, when an alumina capping layer is desired, trimethylaluminum (TMA) can be used together with water to form the capping layer. In such a case, the TMA and water can be alternately pulsed (for example, pulsing TMA for 0.0125 seconds, pulsing water for 0.02 seconds, and delaying 20 seconds between pulses). Each pulsing cycle adds a particular thickness of alumina, so the desired thickness can be controlled by altering the number of pulsing cycles. For example, if a 10 nanometer alumina layer is desired, 100 pulsing cycles may be required. When the desired thickness has been reached, a final water pulse can be used to ensure that the surface of the capping layer has hydroxyl groups rather than methyl groups. Once the capping layer has been formed, the finalized grating can be cooled.

Figure 2:
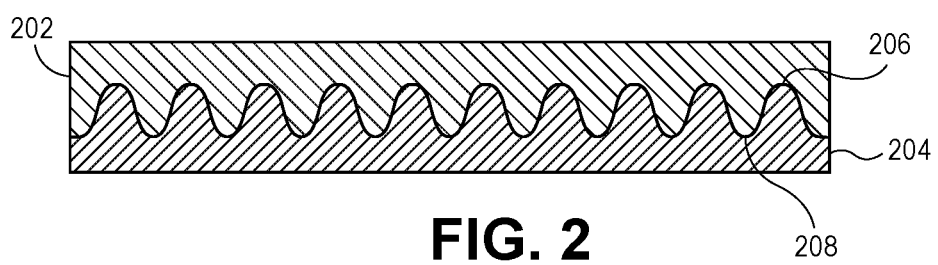
FIG. 2 depicts a cross section of a polymer grating being formed from a master mold.

Turning now to FIG. 2, a polymer grating 202 being formed from a master mold 204 is depicted. Master mold 204 can be composed of a plastic polymer that has been cured to increase rigidity after the templating process. For example, master mold 204 can be made from PDMS as discussed above and cured at a relative humidity between 30% and 70% and temperature between 20 and 30 degrees Celsius for a period of time between 24 and 72 hours.

Master mold 204 has been formed from a template grating structure. Broadly, the grating elements are parallel and positioned adjacent to one another, as depicted. Each grating element is generally elongated, relatively narrow, and is formed with a longitudinal peak 206 positioned next to a longitudinal valley 208. In some embodiments, the longitudinal axis of the grating elements may be straight, while in other embodiments, the longitudinal axis may be curved. In some embodiments, the peak 206 may have a constant and continuous height along the length of the grating element, while in other embodiments, the peak 206 may have a variable height along the length of the grating element. In some embodiments, the desired grating shape (and therefore the template grating structure and the master mold) will be sinusoidal, while in other embodiments, it may be a sawtooth wave shape, a square wave shape, or other periodic or nonperiodic wave shapes. The master mold may additionally take on a variety of structures from the template grating structure, including nanospheres, nanorods, nanopyramids, nanocones and nanocavities of various sizes and aspect ratios. These nanostructures create hotspots where the extraordinary electromagnetic field enhancement and fluorescence enhancement happen in addition to the enhancements from gratings.

Polymer grating 202 takes its shape from master mold 204 and therefore has the same nanograting structure (and other ancillary nanostructures) as the template grating structure. Polymer grating 202 can be made from any appropriate polymer, although (as described above) PMSSQ is particularly suitable. When applied to master mold 204, the PMSSQ may be uncrosslinked, and subsequently crosslinked (via a chemical crosslinker or an annealing process) once it has been formed.

Figure 3:
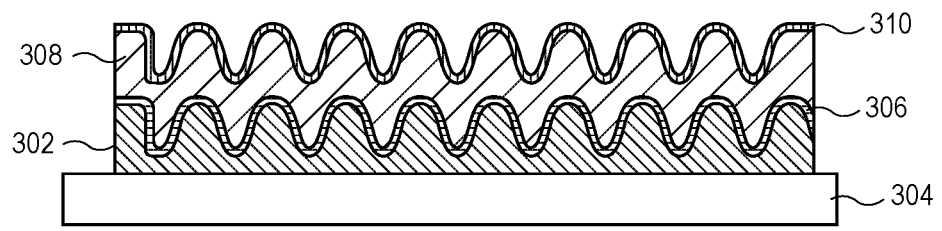
FIG. 3 depicts a cross section of a nanograting structure in accordance with embodiments of the invention.

Turning now to FIG. 3, a finished nanograting structure in accordance with embodiments of the invention is depicted. The grating structure of polymer grating 302 may have feature height of approximately 55 nanometers exclusive of the base thickness, and the base may be of any suitable thickness, depending on the spin-coating process. The polymer grating structure 302 (corresponding to polymer grating 202) has been separated from master mold 204 and crosslinked to improve stability and prevent degradation. In some embodiments, a chemical crosslinker is used in this process (such as APTES, as discussed above). In other embodiments, a thermal annealing process is used to crosslink polymer grating 302. In still other embodiments, both chemical and thermal crosslinking processes are employed. In some embodiments, the crosslinking process is performed before polymer grating 202 is removed from master mold 204. In other embodiments, the crosslinking process is performed after polymer grating 202 has been separated from master mold 202. In still other embodiments, crosslinking is performed both before and after polymer grating 202 and master mold 204 are separated.

In some embodiments, the grating side of polymer grating 302 may be treated to render it hydrophilic. For example, where surface methyl groups render polymer grating hydrophobic, treatment with oxygen plasma may be employed to convert these methyl groups to hydroxyl groups and carboxyl groups and increase hydrophilicity.

The substantially flat side of polymer grating 302 is adhered to substrate 304. In some embodiments, a microcontact printing process is used to adhere polymer grating 302 to substrate 304. In other embodiments, polymer grating 302 may be placed manually or by machine onto substrate 304 and allowed to seal. Substrate 304 may be any rigid body with at least one surface that is flat and smooth, and provides a structural base or foundational support for polymer grating 302. In some embodiments, substrate 304 may be formed from glass slides, plastic substrates (such as polystyrene) or silicon wafers. In other embodiments, a combination of silicon and glass may be used. In some embodiments, polymer grating may be first transferred to a temporary substrate and later transferred from the temporary substrate to a permanent substrate.

On the grating side of polymer grating 302, an adhesion layer 306 may be present to increase the adhesion of polymer grating 302 to other layers such as reflective layer 308. Adhesion layer 306 may be of any suitable material; for example, as described above, adhesion layer 306 may be chromium, chromia, germanium, germania, titanium, titania, or some mixture of these. In some embodiments, multiple adhesion layers are present. In some embodiments, adhesion layer 306 may be approximately five nanometers thick; in other embodiments it may be approximately ten nanometers thick or of other thickness.

On top of adhesion layer 306 is reflective layer 308, which serves to improve the coupling of light with the nanograting. Reflective layer 308 may be of any material with suitable optical properties, such as gold, silver, aluminum, platinum or a mixture of these. In some embodiments, reflective layer 308 is approximately 100 nanometers thick. In other embodiment, reflective layer 308 is approximately 50 nanometers thick or 300 nanometers thick. Other thicknesses, as desirable to optimize optical properties, are also contemplated.

On top of reflective layer 308 is protective capping layer 310, which serves to prevent mechanical and/or oxidative damage to reflective layer 308. Capping layer 308 may be composed of any suitable dense and optically appropriate material. For example, capping layer 310 may be composed of alumina. In other embodiments, silica, titania, ITO, or DLC may be used instead. In some embodiments, protective capping layer 310 may be approximately ten nanometers thick. In other embodiments, capping layer 310 may be approximately five nanometers thick or approximately twenty nanometers thick. In still other embodiments, capping layer 310 is of other thickness as needed to protect reflective layer 308 without interfering with the optical properties of the nanograting structure.

Having thus described various embodiments of the invention, what is claimed as new and desired to be protected by Letters Patent includes the following:

1. A method of manufacturing a nanoscale grating structure, comprising the steps of:
  spin-coating a mold in a solution of a polymer dissolved in a solvent;
  curing the solution of the polymer in the mold to obtain a grating;
  transferring the grating to a substrate;
  applying a hydrophilicity treatment to the grating;
  coating the treated grating in a fluorescence-enhancing reflective layer;
  coating the fluorescence-enhancing reflective layer with a protective layer.

2. The method of claim 1, wherein curing the solution of the polymer comprises exposing the polymer solution to ultraviolet light.

3. The method of claim 1, wherein curing the solution of the polymer comprises exposing the grating to 3-aminopropyltriethoxysilane.

4. The method of claim 1, further comprising the step of annealing the grating.

5. The method of claim 4, wherein the grating is annealed at 60 degrees Celsius for three hours, then heated to 400 degrees Celsius at a rate of 1 degree Celsius per minute, and then held at 400 degrees Celsius for one hour.

6. The method of claim 1, further comprising the step of applying an adhesion layer between the treated polymer grating and the fluorescence-enhancing reflective layer.

7. The method of claim 6, wherein the adhesion layer is made of titanium (IV) oxide.

8. The method of claim 6, wherein the adhesion layer is between approximately 5 nanometers thick and 10 nanometers thick.

9. The method of claim 1, wherein the fluorescence-enhancing reflective layer is made of silver.

10. The method of claim 1, wherein the protective layer is made of aluminum (III) oxide and is approximately 10 nanometers thick.

11. The method of claim 1, wherein the protective layer is deposited using atomic layer deposition.

12. The method of claim 1, wherein the polymer is poly(methylsilsesquioxane).

13. A nanoscale structure, comprising:
a substrate;
a poly(methylsilsesquioxane) base layer applied to the substrate,
wherein the base layer has been subjected to a crosslinker,
wherein the base layer has been subjected to a hydrophilicity agent;
an adhesion layer applied directly to the base layer;
a fluorescence-enhancing reflective layer applied directly to the adhesion layer.

14. The structure of claim 13, wherein the fluorescence-enhancing reflective layer is gold.

15. The structure of claim 13, wherein the fluorescence-enhancing reflective layer is silver, and further comprising a protective layer applied directly to the fluorescence-enhancing reflective layer.

16. The structure of claim 13, wherein the hydrophilicity treatment is exposure to oxygen plasma.

17. The structure of claim 13, wherein the adhesion layer is chromium (III) oxide.

18. The structure of claim 13, wherein the crosslinker is 3-aminopropyltriethoxysilane.

19. The structure of claim 13, wherein the structure is a grating structure.

* * * * *